United States Patent [19]

Arnold et al.

[11] Patent Number: 5,221,062
[45] Date of Patent: Jun. 22, 1993

[54] FREQUENCY SYNTHESIZER

[75] Inventors: Keith P. Arnold, Canoga Park; Robert Rosen, Granada Hills, both of Calif.

[73] Assignee: Hughes Aircraft Company, Los Angeles, Calif.

[21] Appl. No.: 568,374

[22] Filed: Aug. 16, 1990

Related U.S. Application Data

[63] Continuation-in-part of Ser. No. 447,320, Dec. 7, 1989, Pat. No. 5,080,300.

[51] Int. Cl.⁵ .......................... F41G 7/28; F41G 7/30
[52] U.S. Cl. ...................... 244/3.14; 342/103
[58] Field of Search ............... 244/3.14; 455/75, 260, 455/165.1, 192.1, 71; 307/592; 328/14; 331/15, 25; 332/125, 126; 342/103

[56] References Cited

U.S. PATENT DOCUMENTS

| | | | |
|---|---|---|---|
| 3,571,597 | 3/1971 | Wood et al. | 359/153 |
| 4,014,482 | 3/1977 | Esker et al. | 244/3.13 |
| 4,218,656 | 8/1980 | Lazarus | 455/59 |
| 4,219,170 | 8/1980 | Esker | 244/3.14 |
| 4,326,173 | 4/1982 | Newman | 331/1 A |
| 4,470,049 | 9/1984 | Phaneuf et al. | 342/202 |
| 4,724,437 | 2/1988 | Jones et al. | 342/101 |
| 4,829,301 | 5/1989 | Chan et al. | 331/18 X |
| 4,891,649 | 1/1990 | Labaar et al. | 342/203 |
| 4,980,690 | 12/1990 | Fiden | 342/62 |
| 4,983,978 | 1/1991 | Levinson | 342/200 |
| 4,987,373 | 1/1991 | Soo | 328/155 |
| 5,041,799 | 8/1991 | Pirez | 331/44 |
| 5,118,050 | 6/1992 | Arnold et al. | 244/3.14 |

OTHER PUBLICATIONS

1982 IEEE MTT-S International Microwave Symposium Digest, Jun. 15, 1982, Dallas, US pp. 431–433; Brian E. Gilchrist et al.: "The use of Sampling Techniques for Miniaturized Microwave Synthesis Applications".

19th European Microwave Conference 4 Sep. 1989, London, GB pp. 555–560; K. Borst et al.: "Low Noise Synthesized Microwave Local Oscillator for High Capacity Digital Radio Systems using a Dielectric Resonator and a Saw Reference".

DE-A-3 724 490 (Asea Brown Boveri AG), pp. 2 and 3.

*Primary Examiner*—John B. Sotomayor
*Attorney, Agent, or Firm*—Charles D. Brown; Randall M. Heald; Wanda K. Denson-Low

[57] ABSTRACT

A frequency synthesizer (100) for use in combination with the transmitter (30) for transmitting guidance information to one or more ground launched active radar guided missiles simultaneously which is tunable to a plurality of frequencies separated by a predetermined interval. The frequency synthesizer (100) employs a phase-locked loop (110) having a phase detector (114) which receives input signals of common frequency from two dividers (112 and 124). Frequency control is achieved by varying the divisor of one of the dividers (112).

11 Claims, 2 Drawing Sheets

FREQUENCY SYNTHESIZER

CROSS REFERENCE TO RELATED APPLICATIONS

This application is a continuation-in-part application of U.S. Ser. No. 07/447,320 entitled "Launcher Control System" now U.S. Pat. No. 5,080,300 filed Dec. 7, 1989. This application is also related to U.S. Ser. No. 07/568,298 entitled "Launcher Control System" by Rosen et al now U.S. Pat. No. 5,118,050 which is filed concurrently with the present application. These documents are hereby incorporated by reference.

BACKGROUND OF THE INVENTION

1. Technical Field

The present invention relates to missile control systems and more specifically to a frequency synthesizer for a ground launched air-to-air missile data link system.

2. Discussion

One of the purposes of a missile control system is to relay updated target or guidance information to a missile in flight. To accomplish this purpose the missile control system normally employs a transmitter. In the documents incorporated by reference, the transmitter is part of a data link system.

Missile control systems also require flexibility to accomplish their missions and to enhance survivability. One way to achieve this flexibility is to enable the missile control system to communicate with the missile using different frequencies. Although frequency synthesizers are generally well documented, a frequency synthesizer in combination with a radio frequency (RF) transmitter has never been employed to control a ground launched air-to-air missile.

SUMMARY INVENTION

It is an object of the present invention to provide a frequency synthesizer that can generate many different frequency channels for communicating with one or more ground launched active radar guided air-to-air missiles simultaneously.

It is another object of the present invention to provide a frequency synthesizer whose frequency channel spacing and frequencies allow it to operate without interfering with and without interference from ground and aircraft-based radar. In the preferred embodiment the frequency synthesizer is designed to assist control over the flight path of what was originally designed exclusively to be an air-to-air missile, the advanced medium ranged radar air-to-air missile (AMRAAM), although other embodiments envision the same concept being applied to any type of active radar-guided airborne vehicle.

In accordance with the teachings of the present invention, a frequency synthesizer for generating frequencies for communicating with an airborne vehicle is provided. The frequency synthesizer employs a crystal oscillator to generate a reference frequency signal. A signal conditioning circuit coupled to the crystal oscillator generates a signal whose frequency is a multiple of the reference frequency signal. A phase-locked loop generates an electromagnetic signal having a frequency within the X-band of the electromagnetic spectrum. The phase-locked loop is coupled to the crystal oscillator and the output of the signal conditioning circuit. It employs a phase detector which receives input signals of common frequency from two dividers. Frequency control is achieved by varying the divisor of one of the dividers. Thus, frequency changes are made using a predetermined frequency interval.

BRIEF DESCRIPTION OF THE DRAWINGS

Other objects and advantages of the invention will become apparent upon reading the following detailed description and upon reference to the drawings, in which.

DETAILED DESCRIPTION OF THE PREFERRED EMBODIMENT

Figure 1:
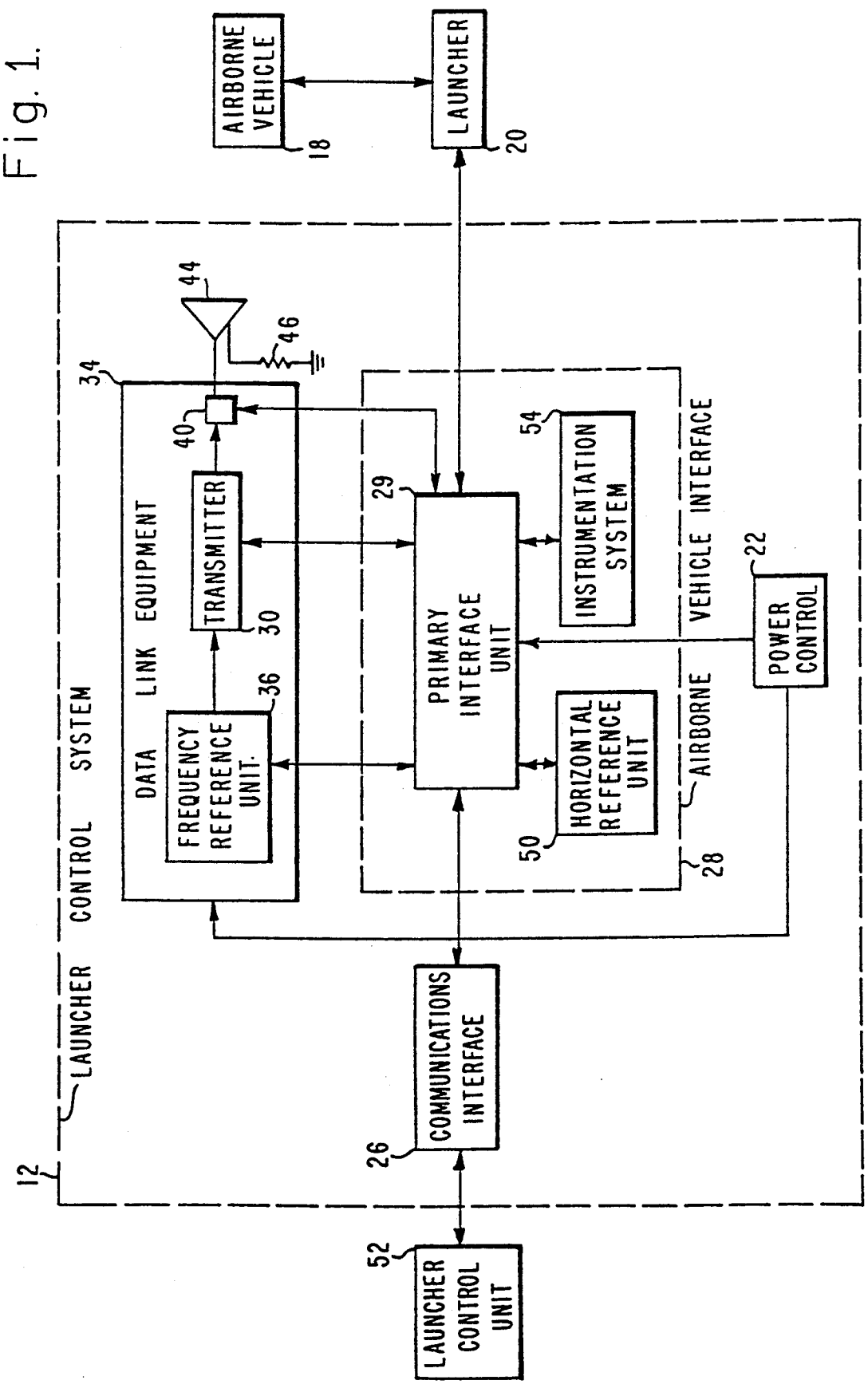
FIG. 1 is a block diagram of a launcher control system incorporating the frequency synthesizer.

There is shown in FIG. 1 a launcher control system 12 in which the present invention finds particular utility. Data link equipment 34 contains a frequency reference unit 36, a transmitter 30, and a load control switch 40. The frequency reference unit 36 corresponds to the frequency synthesizer of the present invention. It produces a band of frequencies within the X-band of the electromagnetic spectrum.

Transmitter 30 transmits the output signal from the frequency reference unit 36. It contains a travelling wave tube amplifier for amplifying the X-band electromagnetic signal.

The load control switch 40 directs the output of the transmitter 30 to the antenna 44 or a dummy load 46. The dummy load 46 is provided to allow for field tests of the data link equipment 34 without danger of spurious microwave radiation. The antenna 44 employs four antenna subsystems each covering a 90 degree swath about the center of the antenna 44.

The airborne vehicle interface 28 provides a variety of control functions throughout the launcher control system 12. A primary interface unit 29 within the housing 24 implements frequency change orders to the frequency reference unit 36, monitors the frequency reference unit 36 for frequency drift, and performs a built-in test of frequency reference unit functions. It signals the transmitter 30 to transmit a pulse code to the airborne vehicle 18, monitors the output power of the transmitted pulse waveform, monitors the transmitter 30 for failure, and performs a built-in test function. It selects the antenna subsystem to be illuminated by the data link equipment 34. Finally, it implements a built-in test function for horizontal reference unit 50.

Horizontal reference unit 50 is a subsystem of the airborne vehicle interface 28 located outside the housing 24 which measures the inclination of the launcher rotating platform.

The launcher control unit 52 implements the firing orders of the operator and implements self-test functions for the airborne vehicle interface 28. It also relays targeting information to the airborne vehicle interface 28.

Instrumentation system 54 is a subsystem of the airborne vehicle interface 28. It too is located outside the housing 24. It is a data collection system used to monitor operation of the airborne vehicle interface 28.

The airborne vehicle interface 28 is coupled to the launcher control unit 52 through the communications interface 26, which employs one or more standard serial communications interface units and one or more discrete signal communications interface units.

The airborne vehicle interface 28 communicates with the launcher 20 through a series of interfaces. A standard differential serial interface 1533 is used as well as several discrete interfaces.

The power distribution unit 32 provides 28 volt DC power to the data link equipment 34 and the airborne vehicle interface 28. It receives three-phase 400 Hertz power from power source 22. Three-phase 400 Hertz power is also sent to the airborne vehicle interface 28. Three-phase power and 28 volt DC power are sent to the launcher 20 via the airborne vehicle interface 28.

Figure 2:
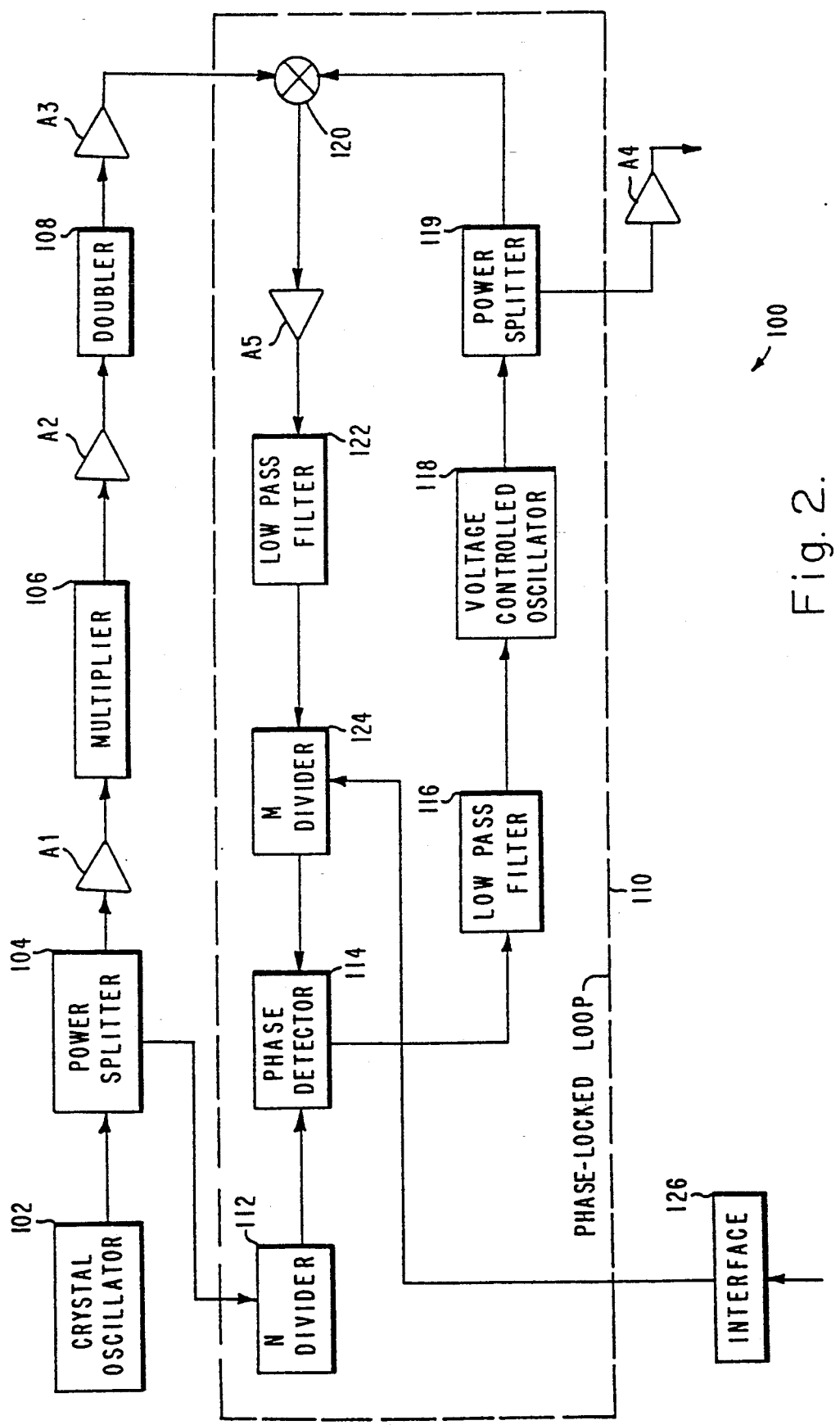
FIG. 2 is a block diagram of the frequency synthesizer of the present invention.

Turning now to FIG. 2 there is shown the frequency synthesizer 100 of the present invention. Crystal oscillator 102 produces a constant reference frequency signal with virtually no drift. This signal is split at power splitter 104. One branch of the power splitter 104 feeds a divider having divisor N, which is part of a phase-locked loop 110.

Out of the power splitter 104 the reference frequency signal is amplified and buffered by amplifier A1 and then multiplied by frequency multiplier 106. The multiplied signal is further amplified and buffered by amplifier A2 and coupled to a doubler 108. The output signal from the doubler is amplified and buffered by amplifier A3. Amplifier A3 is coupled to mixer 120, which is part of the phase-locked loop 110.

The heart of the frequency synthesizer 100 is the phase-locked loop 110. The phase-locked loop 110 employs a phase detector 114 which receives two input signals of the same frequency. The phase detector 114 produces an output signal having direct current (DC) and alternating current (AC) components. Low pass filter 116 removes the AC components, leaving the DC component, whose magnitude is a function of the phase angle between the two input signals to the phase detector 114. Low pass filter 116 produces a narrow band characteristic so that noise is reduced.

The DC output voltage of the low pass filter 116 controls a voltage controlled oscillator 118. The voltage controlled oscillator 118 produces a band of frequencies within the X-band of the electromagnetic spectrum. The output of the voltage controlled oscillator 118 is coupled to transmitter 30 through power splitter 119 and buffer amplifier A4.

The output from the voltage controlled oscillator 118 is also coupled to mixer 120. The mixer 120 combines the output signal from the voltage controlled oscillator 118 with the signal from amplifier A3 to produce sum and difference frequencies and their harmonics. The output signal from the mixer 120 is amplified and buffered by amplifier A5 and filtered by low pass filter 122, which passes only the difference frequency.

The difference frequency signal is then fed into a divider 124 having a divisor M. The divisor M is variable and controlled by the interface 126. The output signal from the divider 124 is coupled to the phase detector 114 and is of the same frequency as the output from the divider 112 having divisor N. In the preferred embodiment, the divisor N is fixed.

In operation the frequency synthesizer 100 changes frequency in steps yielding a predetermined number of channels and a wide bandwidth. Operaters at the launcher control unit 52 signal the interface 122 to change the divisor M. Commands are sent through the primary interface unit 29. When the divisor M is changed, the output of the voltage controlled oscillator 118 changes to maintain the two input signals to the phase detector 114 at a same predetermined frequency.

The low pass filter 116 locks the voltage controlled oscillator 118 in phase with the input signals to the phase detector 114.

Advantageously the frequency synthesizer 100 is flexible in design. It generates the full range of frequencies that the AMRAAM is capable of receiving. Because it is able to generate signals on many different frequency channels it can communicate with one or more AMRAAMs simultaneously. Its channel spacing and frequencies allow it operate without interfering with either ground or aircraft-based radar. It is also less susceptible to jamming or homing by unfriendly forces. Finally, it has a data bus which is compatible with the airborne vehicle interface 28 or a similar digital controller.

The frequency synthesizer 100 is accurate and has sufficient power to accomplish its mission. It has the ability to generate sufficient radio frequency (RF) power for transmission. It has the ability to generate the modulation waveforms necessary to communicate with an AMRAAM. It has built-in test circuits to ensure proper operation. Most importantly, the phase-locked loop circuitry enables it to produce very little amplitude modulation (AM) and phase modulation (PM) noise. Thus, targeting and guidance information is accurately communicated to the AMRAAM.

Although the invention has been described with particular reference to certain preferred embodiments thereof, variations and modifications can be effected within the spirit and scope of the following claims.

What is claimed is:

1. An apparatus for generating an electromagnetic signal for transmission to an airborne vehicle comprising:
   (a) frequency reference means for generating a constant frequency reference signal;
   (b) signal conditioning means coupled to said frequency reference means for generating a signal whose frequency is a multiple of the constant frequency signal;
   (c) phase-locked loop circuit means coupled to said frequency reference means and said signal conditioning means for generating the electromagnetic signal; and
   (d) frequency control means coupled to said phase-locked loop circuit means for varying the frequency of the electromagnetic signal;
   said phase-locked loop circuit means comprising:
   (i) a first divider coupled to said frequency reference means;
   (ii) a phase detector coupled to said first divider;
   (iii) a second divider coupled to the phase detector;
   (iv) a first low pass filter coupled to the output of the phase detector;
   (v) a voltage controlled oscillator coupled to the first low pass filter;
   (vi) mixing means for mixing the output signal from the voltage controlled oscillator with the output signal from the signal conditioning means;
   (vii) a buffer amplifier coupled to the output of said mixer; and
   (viii) a second low pass filter coupled between the buffer amplifier and the second divider.

2. The apparatus as recited in claim 1 wherein said frequency control means varies the divisor of the second divider.

3. The apparatus as recited in claim 1 wherein said frequency control means varies the divisor of the first divider.

4. The apparatus as recited in claim 1 wherein said frequency control means changes the frequency of the electromagnetic signal by a predetermined interval.

5. The apparatus as recited in claim 1 wherein said electromagnetic signal has a frequency within the X-band of the electromagnetic spectrum.

6. The apparatus as recited in claim 1 having a predetermined bandwidth.

7. The apparatus as recited in claim 1 used to transmit guidance information to a ground launched active radar guided missile.

8. The apparatus as recited in claim 1 used to transmit guidance information to a plurality of ground launched active radar guided missiles simultaneously.

9. An apparatus for generating an X-band electromagnetic signal for transmission to a ground launched active radar guided missile comprising:
   (a) a frequency reference means for generating a constant frequency reference signal, said frequency reference means including a crystal oscillator;
   (b) signal conditioning means coupled to said frequency reference means for producing a signal having a frequency which is a multiple of the constant frequency reference signal, said signal conditioning means including a first buffer amplifier, a multiplier coupled to the first buffer amplifier, a second buffer amplifier coupled to the multiplier, a doubler coupled to the second buffer amplifier and a third buffer amplifier coupled to the doubler;
   (c) phase-locked loop circuit means for generating the X-band electromagnetic signal, said phase-locked loop circuit means including a first divider coupled to the frequency reference means, a phase detector coupled to the first divider, a second divider coupled to the phase detector, a first low pass filter coupled to the output of the phase detector, a voltage controlled oscillator coupled to the first low pass filter, mixing means coupled to the voltage controlled oscillator and signal conditioning means for mixing the electromagnetic signal with the X-band output signal of the signal conditioning means, a fourth buffer amplifier coupled to the mixing means and a second low pass filter coupled between the fourth buffer amplifier and the second divider; and
   (d) frequency control means for changing the frequency of the X-band electromagnetic signal, said frequency control means changing the frequency of the electromagnetic signal by changing the divisor of the second divider, said frequency changes being in predetermined intervals.

10. The apparatus a recited in claim 9 having a predetermined bandwidth.

11. The apparatus as recited in claim 10 used to transmit guidance information to a plurality of ground launched active radar guided missiles simultaneously.

* * * * *